(12) United States Patent
Lee et al.

(10) Patent No.: US 7,485,907 B2
(45) Date of Patent: Feb. 3, 2009

(54) ARRAY SUBSTRATE FOR LIQUID CRYSTAL DISPLAY DEVICE AND THE SEAL PATTERN IN THE PERIPHERY OF THE DISPLAY

(75) Inventors: Ju-Bok Lee, Gyeongsangbuk-do (KR); Jae-Gu Lee, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 205 days.

(21) Appl. No.: 11/368,465

(22) Filed: Mar. 7, 2006

(65) Prior Publication Data

US 2007/0085116 A1 Apr. 19, 2007

(30) Foreign Application Priority Data

Oct. 17, 2005 (KR) .................. 10-2005-0097475

(51) Int. Cl.
*H01L 31/062* (2006.01)
*H01L 31/113* (2006.01)

(52) U.S. Cl. .................. 257/291; 257/59; 257/72; 257/443; 257/E27.133; 349/149; 349/152

(58) Field of Classification Search ........... 257/291, 257/443, E27.133, 59, 72; 349/152, 149
See application file for complete search history.

(56) References Cited

U.S. PATENT DOCUMENTS

| 6,853,405 | B2 * | 2/2005 | Lee ............................ 349/39 |
| 2001/0022639 | A1 * | 9/2001 | Kwak et al. ................. 349/122 |
| 2004/0152320 | A1 * | 8/2004 | Kim et al. ................... 438/689 |

* cited by examiner

*Primary Examiner*—Thanh V Pham
*Assistant Examiner*—Alexander Belousov
(74) *Attorney, Agent, or Firm*—Holland & Knight LLP

(57) ABSTRACT

A substrate for a display device includes a plurality of first lines on the substrate in a display area of the display device, a plurality of link lines on the substrate in a link region, the link lines electrically connected to the first lines and the link region being in a non-display area of the display device, an insulating layer on the first lines and the link lines, a plurality of second lines on the insulating layer, patterns on the insulating layer in the link region and at least partially overlapping the link lines, the patterns including an intrinsic semiconductor material, and a passivation layer on the second lines and the patterns, the passivation layer having at least one through hole exposing the intrinsic semiconductor material of at least one of the patterns.

12 Claims, 12 Drawing Sheets

ARRAY SUBSTRATE FOR LIQUID CRYSTAL DISPLAY DEVICE AND THE SEAL PATTERN IN THE PERIPHERY OF THE DISPLAY

The present invention claims the benefit of Korean Patent Application No. 2005-0097475 filed in Korea on Oct. 17, 2005, which is hereby incorporated by reference.

BACKGROUND OF THE INVENTION

1. Field of the Invention

The present invention relates to a display device, and more particularly, relates to an array substrate for a liquid crystal display (LCD) device and a manufacturing method of the same.

2. Discussion of the Related Art

Our information-based society has an increasing demand for flat panel display (FPD) devices. FPD devices include plasma display panel (PDP) devices, field emission display (FED) devices, electroluminescent display (ELD) devices, liquid crystal display (LCD) devices, and so on. Since they are small and lightweight and have low power consumption, FPD devices are taking the place of cathode ray tube (CRT) display devices.

Among the various FPD devices, LCD devices are particularly useful in notebook computers and desktop monitors, because they provide excellent resolution, color display and image quality. An LCD device relies on optical anisotropy and polarizability of liquid crystal molecules to produce an image. Liquid crystal molecules are aligned with directional characteristics resulting from their long, thin shapes and are arranged at specified pre-tilt angles. The alignment direction of the liquid crystal molecules can be controlled by applying an electric field across the liquid crystal molecules. Varying an applied electric field influences alignment of the liquid crystal molecules. Because of the optical anisotropy of liquid crystal molecules, refraction of incident light depends on the alignment direction of the liquid crystal molecules. Thus, by properly controlling the applied electric field, a desired image can be produced.

A typical LCD panel includes an upper substrate, a lower substrate facing the upper substrate, and a liquid crystal material layer interposed therebetween. An electric field is generated in the LCD panel by applying voltages to electrodes formed on the upper and lower substrates and changes alignment of the liquid crystal molecules, to thereby change light transmission and to display images.

In general, the LCD panel is fabricated by forming an array substrate that includes a thin film transistor as a switching element and a pixel electrode connected to the thin film transistor in a pixel region, forming a color filter substrate that includes at least red, green and blue color filters corresponding to the pixel region and a common electrode, attaching the array substrate and the color filter substrate by a seal pattern, and then injecting a liquid crystal material between the attached array substrate and color filter substrate.

A seal pattern generally contacts a passivation layer of the array substrate. In particular, because a passivation layer typically is formed of an organic insulating material, which has poor adhesion to a seal material, there exists a need to improve seal adhesion between the array substrate and the color filter substrate.

FIG. 1 is a plan view illustrating an array substrate for an LCD device according to the related art, and FIG. 2 is a cross-sectional view along II-II of FIG. 1. In FIG. 1, a substrate 10 includes a display area AA and a non-display area NA. The non-display area NA includes a gate link region GLA, a gate pad region GPA, a data link region (not shown), and a data pad region (not shown). In the display area AA, gate lines 12 are formed in a horizontal direction, and data lines 22 are formed in a vertical direction. The gate lines 12 and the data lines 22 cross each other to define pixel regions P, and a thin film transistor Tr is formed at each crossing of the gate lines 12 and the data lines 22.

In the gate pad region GPA, gate pads 42 are formed and are connected to outer driving circuits (not shown), and in the gate link region GLA, gate link lines 14 are formed and are connected to the gate pads 42 and the gate lines 12. Although not shown, in the data pad region, data pads are formed and are connected to the outer driving circuits, and the data link region, data link lines are formed and are connected to the data pads and the data lines 22. In addition, a passivation layer 38 is formed on the array substrate over the thin film transistor Tr, the gate lines 12, the gate link lines 14, and the data lines 22.

To attach the array substrate to a color filter substrate, a seal pattern 70 is formed on the passivation layer 38. In particular, the seal pattern 70 is disposed around the display area AA in the gate link region GLA and the data link region (not shown).

However, because the passivation layer 38 is formed of an organic insulating material, which has poor adhesion to the seal pattern 70, there exists a need to improve seal adhesion between the array substrate and the color filter substrate. Thus, through holes are made in the passivation layer 38, such that the seal pattern 70 contacts a layer other than the passivation layer.

Still, when the passivation layer 38 is etched for forming the through-holes, a gate insulating layer under the passivation layer is frequently etched due to thickness differences of the passivation layer or due to over-etching of the passivation layer to expose the gate link line 14. As a result, corrosion along the gate link line 14 is likely to occur. To address this problem, the dummy patterns 21 are formed under the passivation layer as an etch stopper.

In particular, a plurality of dummy patterns 21 are formed under the passivation layer 38 in the gate link region GLA, are in the same layer as the data lines 22, and has the same material as the data lines 22. Thus, the dummy pattern 21 has a multi-layered structure including an amorphous silicon layer 21a, a doped amorphous silicon layer 21b, and a metal layer 21c.

In addition, the passivation layer 38 is etched to form a plurality of through-holes to expose the doped amorphous silicon layer 21b and the metal layer 21c of the dummy pattern 21. As a result, in addition to contacting the passivation layer 38, the seal pattern 70 also contacts the doped amorphous silicon layer 21b and the metal layer 21c, to thereby provide additional adhesion between the array substrate and the color filter substrate.

To effectively prevent the gate insulating layer 17 from being etched when the passivation layer 38 is patterned, the dummy pattern 21 has a larger size than the through hole 40. Thus, the metal pattern 21c remains at the edge portion of the dummy pattern 21. That is, a portion of the dummy pattern 21 has a three-layer structure and another portion has a two-layer structure.

Nonetheless, there may be electrical short between the metal pattern of the dummy pattern and the gate link lines. For example, when the array substrate and the color filter substrate are attached, the array substrate and the color filter substrate are under high voltage and high temperature for several hours and are pressured. The pressure can create cracks in the gate insulating layer and result hillock or migration of a metallic material for the gate link lines being in the cracks. Such metallic materials can contact the metal pattern of the dummy pattern causing an electric short and creating a defect.

SUMMARY OF THE INVENTION

Accordingly, the present invention is directed to an array substrate for a liquid crystal display device and a manufacturing method of the same that substantially obviate one or more problems due to limitations and disadvantages of the related art.

An object of the present invention is to provide an array substrate for a liquid crystal display device and a manufacturing method of the same that improve adhesion of a seal pattern.

Another object of the present invention is to provide an array substrate for a liquid crystal display device and a manufacturing method of the same that reduce manufacturing costs, simplify manufacturing processes and prevent electrical short.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a substrate for a display device includes a plurality of first lines on the substrate in a display area of the display device, a plurality of link lines on the substrate in a link region, the link lines electrically connected to the first lines and the link region being in a non-display area of the display device, an insulating layer on the first lines and the link lines, a plurality of second lines on the insulating layer, patterns on the insulating layer in the link region and at least partially overlapping the link lines, the patterns including an intrinsic semiconductor material, and a passivation layer on the second lines and the patterns, the passivation layer having at least one through hole exposing the intrinsic semiconductor material of at least one of the patterns.

In another aspect of the present invention, a substrate for a display device includes a plurality of first lines on a substrate, a link line in a peripheral region of the substrate, the link line electrically connected to one of the first lines, an insulating layer on the first lines and the link line, a plurality of second lines on the insulating layer, a pattern on the insulating layer in the peripheral region and at least partially overlapping the link line, the pattern including a undoped semiconductor material, and a passivation layer on the second lines and the pattern, the passivation layer having at least one through hole exposing the undoped semiconductor material of the pattern.

In yet another aspect of the present invention, a manufacturing method of a substrate for a display device includes forming a plurality of first lines on the substrate in a display area of the display device, forming a plurality of link lines on the substrate in a link region, the link lines electrically connected to the first lines and the link region being in a non-display area of the display device, forming an insulating layer on the first lines and the link lines, forming a plurality of second lines on the insulating layer, forming patterns on the insulating layer in the link region, the patterns at least partially overlapping the link lines and an intrinsic semiconductor material, forming a passivation layer on the second lines and the patterns, and patterning the passivation layer to form at least one through hole in the passivation layer, the at least one through hole exposing the intrinsic semiconductor material of at least one of the patterns.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to preferred embodiments of the present invention, examples of which are illustrated in the accompanying drawings.

Figure 1:
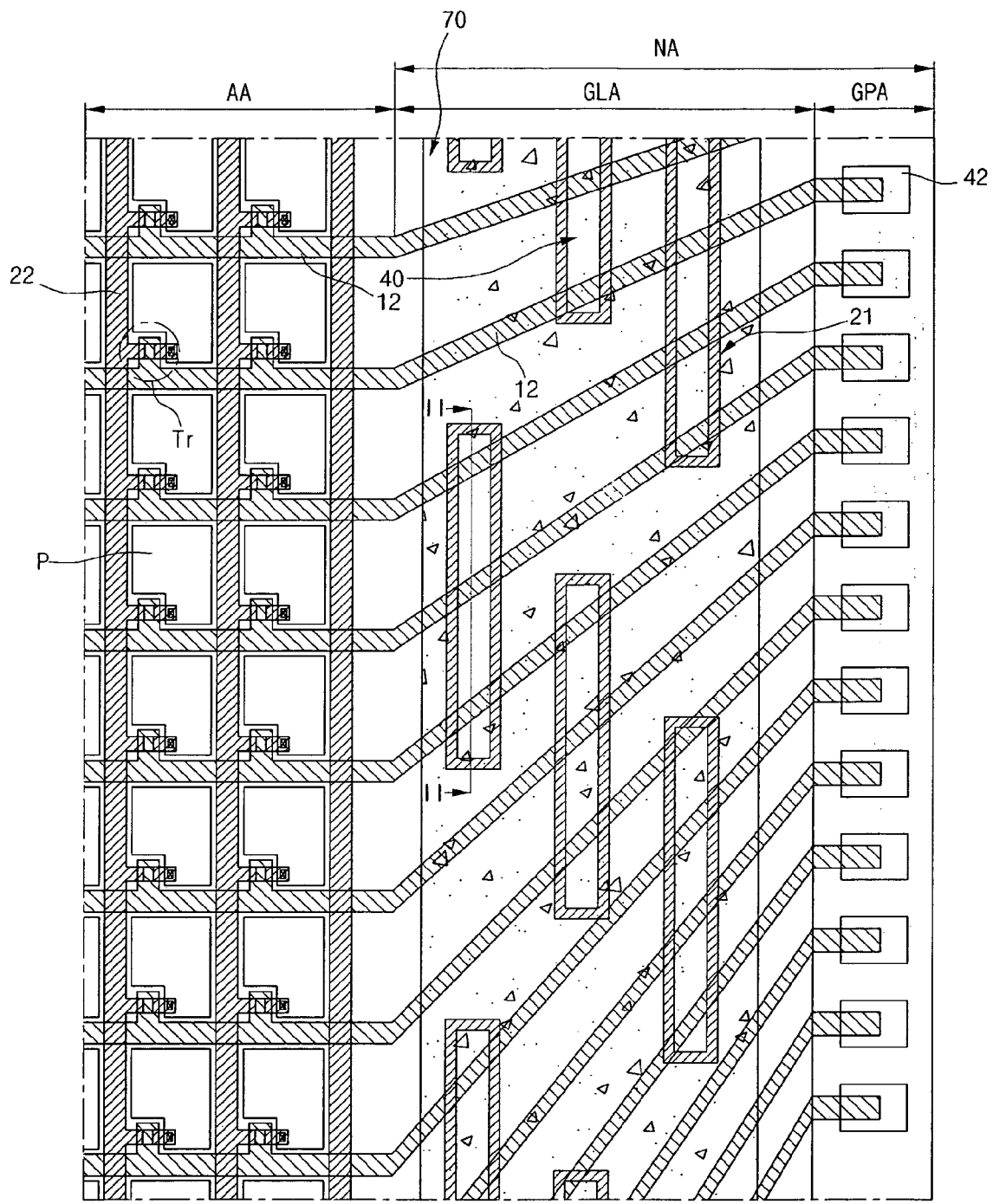
FIG. 1 is a plan view illustrating an array substrate for an LCD device according to the related art.
Figure 2:
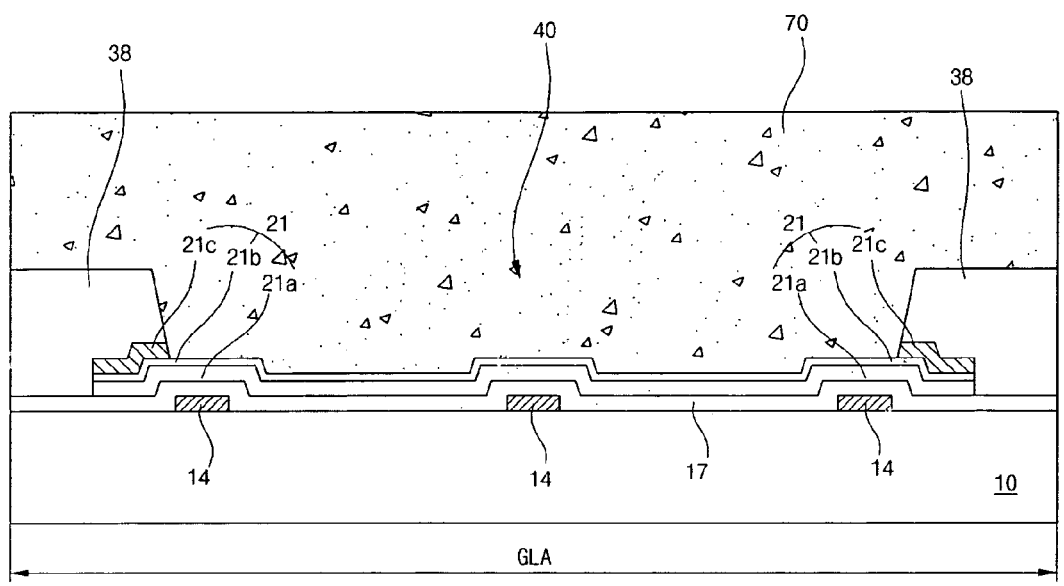
FIG. 2 is a cross-sectional view along II-II of FIG. 1.
Figure 3:
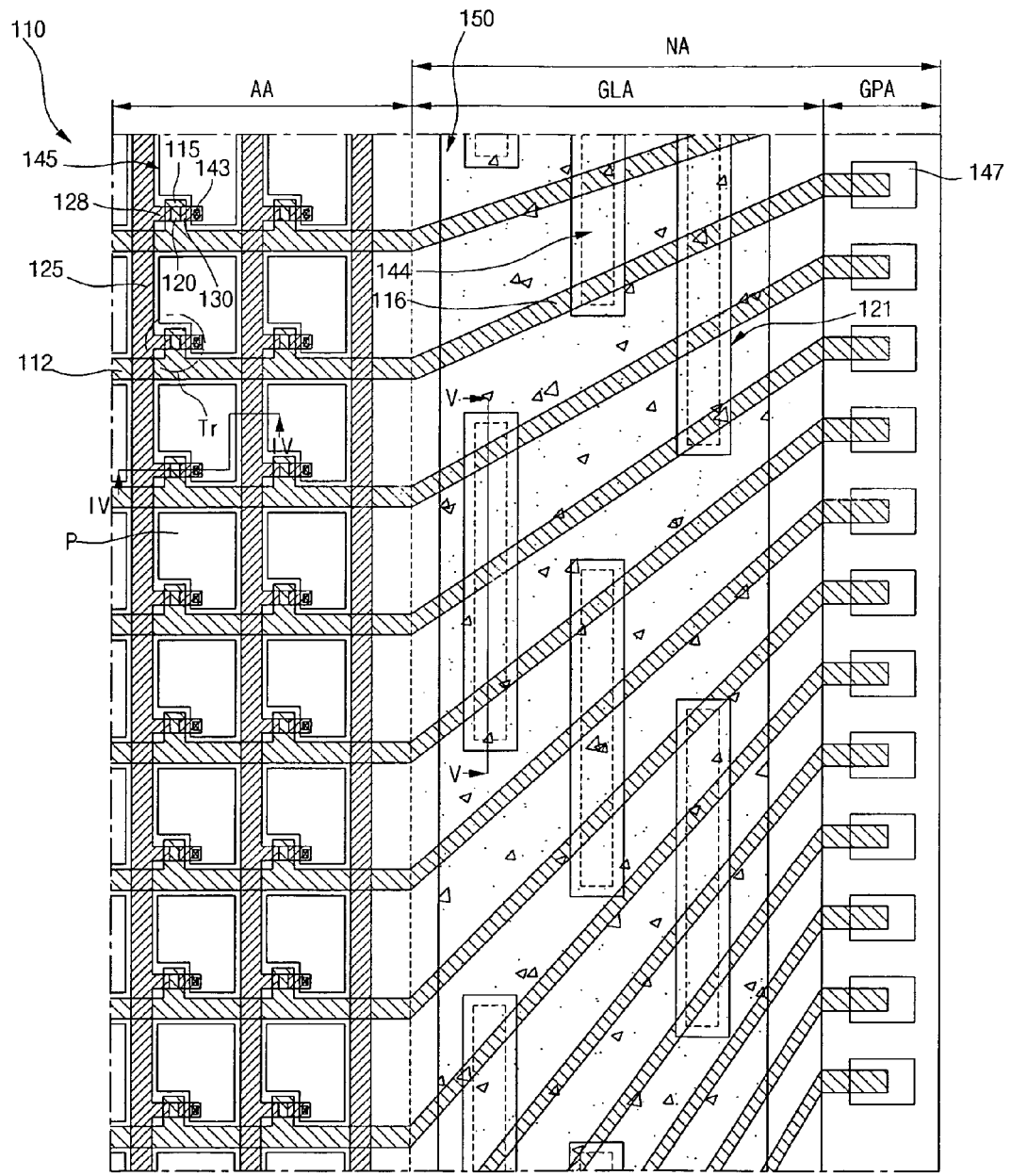
FIG. 3 is a plan view illustrating an array substrate for an LCD device according to an embodiment of the present invention.

FIG. 3 is a plan view illustrating an array substrate for an LCD device according to an embodiment the present invention. In FIG. 3, the array substrate includes a display area AA and a non-display area NA. The non-display area NA includes a gate link region GLA, a gate pad region GPA, a data link region (not shown), and a data pad region (not shown).

In the display area AA, gate lines 112 are formed in a horizontal direction in the context of the figure, and data lines 125 are formed in a vertical direction in the context of the figure. The gate lines 112 and the data lines 125 cross each other to define pixel regions P, and a thin film transistor Tr is formed at each crossing of the gate lines 112 and the data lines 125. A pixel electrode 145 is formed at each pixel region P and is connected to the thin film transistor Tr. Although not shown, one or both of the gate lines 112 and the date lines 125 may instead be formed in a non-linear direction.

In the gate pad region GPA, gate pads 147 are formed and are electrically connected to exterior driving circuits (not shown). In the gate link region GLA, gate link lines 116 are formed and are electrically connected to the gate pads 147 and the gate lines 112. Although not shown, data pads are formed in the data pad region and are electrically connected to exterior driving circuits, and data link lines are formed in the data link region and are electrically connected to the data pads and the data lines 125.

Dummy patterns 121 may be formed in the gate link region GLA. The dummy patterns 121 overlap the gate link lines 116 and have a single-layer structure of a semiconductor material, more particularly, an intrinsic amorphous silicon material. In addition, the dummy patterns 121 may function as an etch stopper during a manufacturing method, which will be explained in details later. The intrinsic amorphous silicon material is not electrically charged as compared to a metallic material. Thus, although conductive materials for the gate link lines 116 contact the dummy patterns 21 due to hillock or migration through cracks in an insulating layer, there is no electrical short problem.

A passivation layer (not shown) covers the dummy patterns 121 and has a plurality of through-holes 144 smaller than the dummy patterns 121.

To attach the array substrate to a color filter substrate, a seal pattern 150 may be formed on the passivation layer. In particular, the seal pattern 150 may be disposed around the display area AA in the gate link region GLA and the data link region (not shown). Alternatively, the seal pattern 150 instead may be formed on a region of the color filter substrate corresponding to the gate link region GLA and the data link region (not shown) of the array substrate.

The structure of the array substrate will be explained in more detail with reference to the attached drawings of cross-sectional views.

Figure 4:
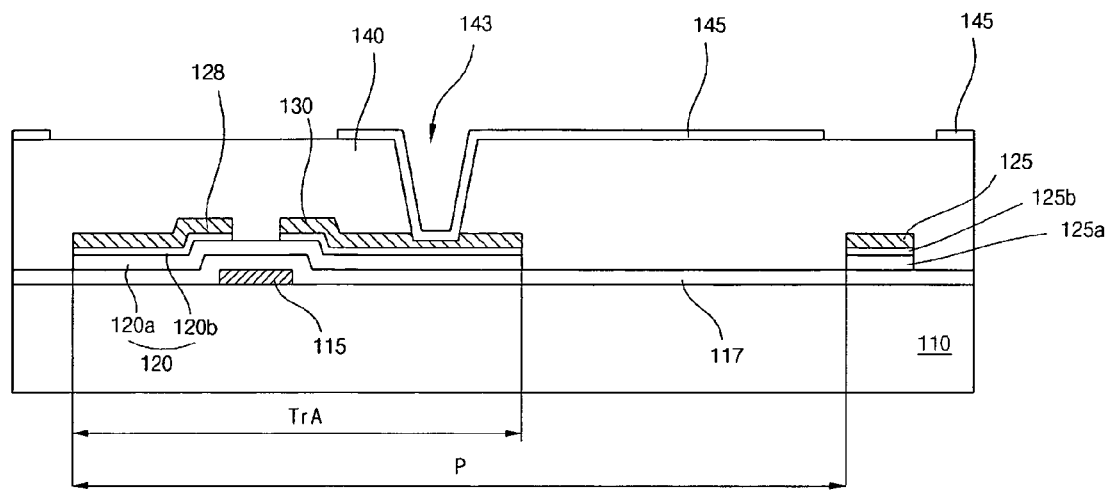
FIG. 4 is a cross-sectional view along IV-IV of FIG. 3.
Figure 5:
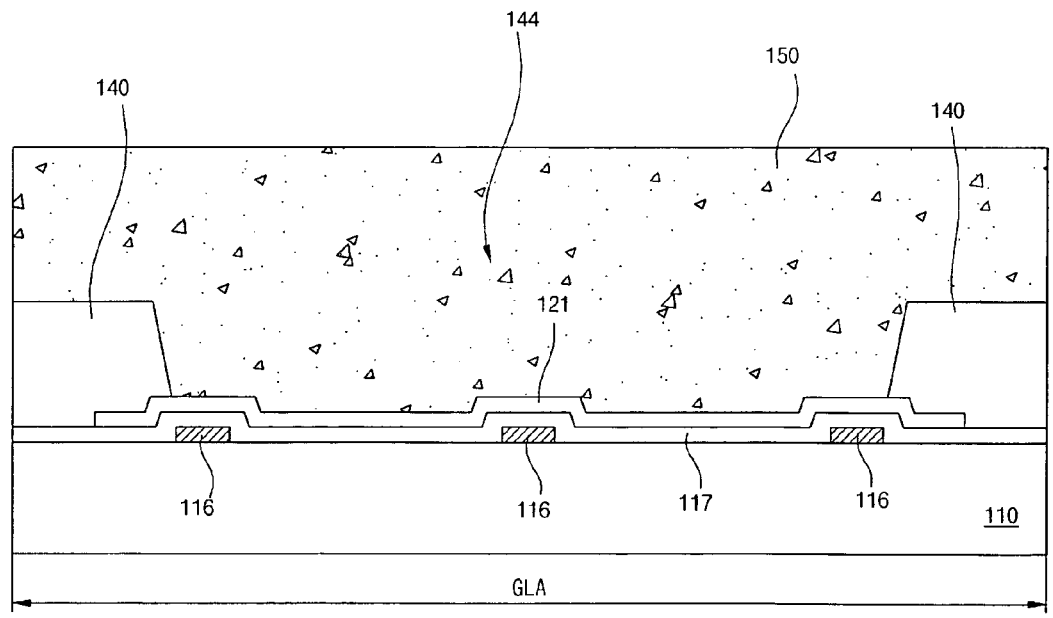
FIG. 5 is a cross-sectional view along V-V of FIG. 3.

FIG. 4 is a cross-sectional view along IV-IV of FIG. 3, and FIG. 5 is a cross-sectional view along V-V of FIG. 3. In particular, FIG. 4 illustrates the pixel region including a thin film transistor in the display area, and FIG. 5 illustrates a part of the gate link region including a dummy pattern. For convenience of explanation, a region in which a thin film transistor is formed also may be referred to as a switching region.

As shown in FIGS. 4 and 5, a pixel region P, a switching region TrA, and a gate link region GLA are defined on a substrate 110. A gate electrode 115 and a gate line (not shown) are formed of a first conductive material. The gate electrode 115 is disposed in the switching region TrA, and the gate line is electrically connected to the gate electrode 115 and extended in a first direction. In the gate link region GLA, a gate link line 116 may be formed of the same material in the same layer as the gate line. The gate link line 116 is electrically connected to the gate line and may be extended from one end of the gate line.

In addition, a gate insulating layer 117 is formed on the substrate 110 including the gate electrode 115 and the gate link lines 116. The gate insulating layer 117 may include an inorganic insulating material. A semiconductor layer 120 is formed on the gate insulating layer 117 in the switching region TrA. The semiconductor layer 120 includes an active layer 120a of intrinsic amorphous silicon, e.g., undoped silicon, and an ohmic contact layer 120b of doped amorphous silicon on the active layer 120a. Source and drain electrodes 128 and 130 are formed of a conductive material, for example, molybdenum (Mo), on the ohmic contact layer 120b. The source and drain electrodes 128 and 130 are spaced apart from each other over the gate electrode 115. The ohmic contact layer 120b may have the same shape as the source and drain electrodes 128 and 130.

Further, a data line 125 is formed on the gate insulating layer 117 and is electrically connected to the source electrodes 128. The data line 125 crosses the gate line (not shown). The data line 125 may be formed of the same material in the same layer as the source and drain electrodes 128 and 130. In addition, an intrinsic amorphous silicon pattern 125a, e.g., a undoped amorphous silicon pattern, and a doped amorphous silicon pattern 125b are formed under the data line 125.

In the gate link region GLA, a dummy pattern 121 of an intrinsic amorphous silicon material is formed on the gate insulating layer 117.

A passivation layer 140 is formed on the substrate 110 including the source and drain electrodes 128 and 130, the data line 125 and the dummy pattern 121. The passivation layer 140 may include an organic insulating material, such as benzocyclobutene (BCB) or photo acryl. The passivation layer 140 has a drain contact hole 143 exposing the drain electrode 130 and/or the ohmic contact layer 120b under the drain electrode 130. The passivation layer 140 also has a through-hole 144 in the gate link region GLA exposing the dummy pattern 121. The shape of the through-hole 144 may have about a similar shape as the dummy pattern 121 but smaller in size than the dummy pattern 121.

Moreover, a pixel electrode 145 is formed on the passivation layer 140 in the pixel region P. The pixel electrode 145 is formed of a transparent conductive material and is electrically connected to the drain electrode 130 through the drain contact hole 143. Although not shown, a portion of the pixel electrode 145 may overlap the data line 125. Further, when the passivation layer 140 is over-etched, a region of the drain electrode 130 may be substantially entirely removed, and the ohmic contact layer 120b may be exposed through the drain contact hole 143. In this case, the pixel electrode 145 may be connected to the exposed ohmic contact layer 120b and sides of the drain electrode 130.

Furthermore, a seal pattern 150 may be formed on the passivation layer 140 in the gate link region GLA. The seal pattern 150 may contact the passivation layer 140 and the dummy pattern 121 through the through-hole 144.

When the above array substrate and a color filter substrate are attached, cracks may be formed in the gate insulating layer 117 in the gate link region GLA due to pressures. Therefore, there may occur migration or hillock of conductive materials from the gate link lines 116 through the cracks, and the conductive materials from the gate link lines 116 may contact the dummy pattern 121. However, because the dummy pattern 121 is not a conductor, an electrical short between the gate link lines 116 and the dummy pattern 121 can be prevented, to thereby improve device performance.

FIGS. 6A to 6G and FIGS. 7A to 7G are cross-sectional views illustrating a manufacturing method of an array substrate according to an embodiment of the present invention. In particular, FIGS. 6A to 6G illustrate the manufacturing method of a region of the substrate that corresponds to cross-sections along IV-IV of FIG. 3, and FIGS. 7A to 7G illustrate the manufacturing method of a region of the substrate that corresponds to cross-sections along V-V of FIG. 3.

Figure 6A:
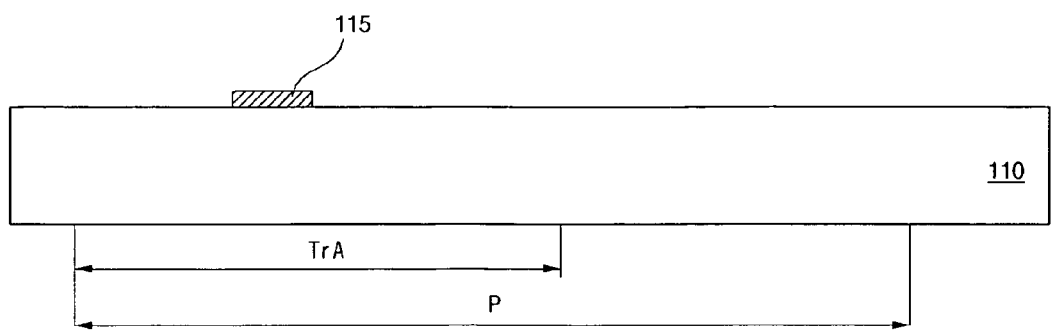
FIGS. 6A to 6G are cross-sectional views illustrating a manufacturing method of an array substrate for an LCD device according to an embodiment of the present invention and correspond to cross-sections along IV-IV of FIG. 3.
Figure 7A:
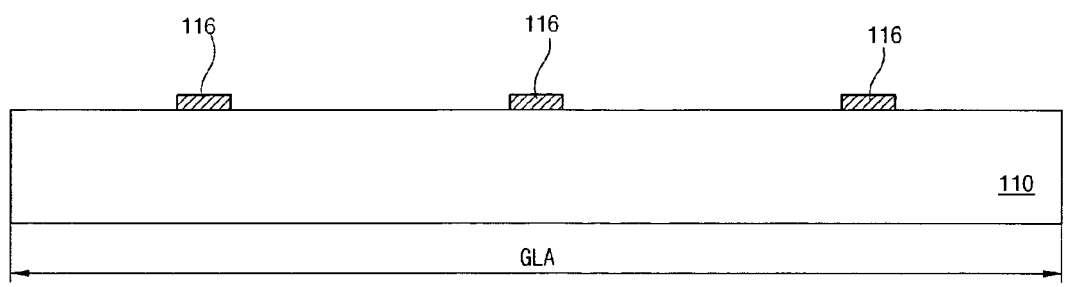
FIGS. 7A to 7G are cross-sectional views illustrating an manufacturing method of an array substrate according to an embodiment the present invention and correspond to cross-sections along V-V of FIG. 3.

As shown in FIG. 6A and FIG. 7A, a substrate 110 has a pixel region P, a switching region TrA, and a gate link region GLA. The substrate 110 may be transparent and may be formed of glass. In addition, the switching region TrA may be within the pixel region P.

Although not shown, a gate material and a photoresist material are deposited sequentially on the substrate 110, and a photoresist pattern is formed on the gate material by a photoresist coating, selective exposure and developing process. For example, the gate material may include one or more conductive materials, and the photoresist material may be coated on the substrate 110, exposed to light through a mask, and developed, to thereby form the photoresist pattern.

After forming the photoresist pattern, the gate material is etched using the photoresist pattern as an etching mask to form a gate electrode 115 in the switching region TrA, a gate line (not shown), and a gate link line 116 in the gate link region GLA. After etching, remaining of the photoresist pattern is stripped from the substrate. In particular, the gate electrode 115, the gate line (not shown) and the gate link line 116 are electrically connected to one another. For example, the gate electrode 115 may protrude from the gate line (not shown), and the gate link line 116 may extended from an end of the gate line (not shown).

Figure 6B:
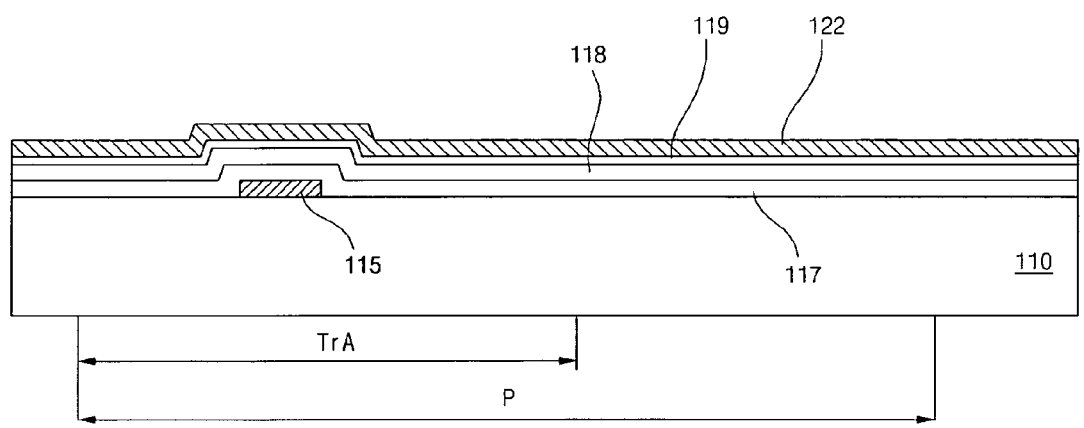
Figure 7B:
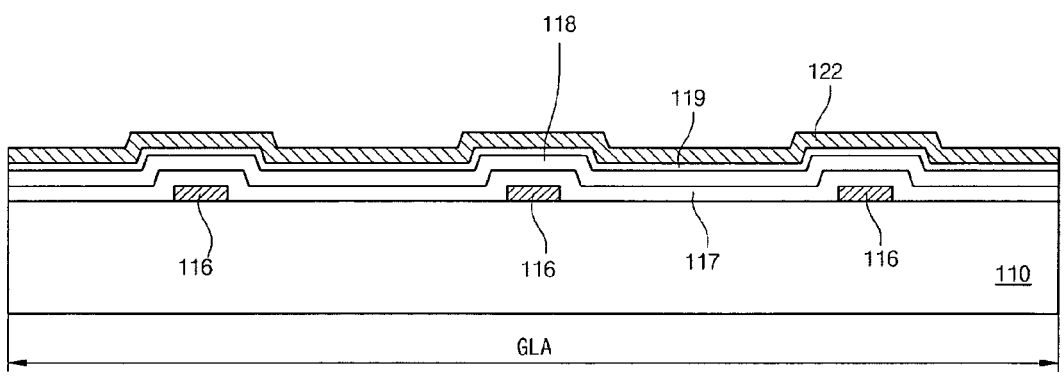

As shown in FIG. 6B and FIG. 7B, a gate insulating layer 117 is formed on the substrate 110 including the gate line, the gate electrode 115 and the gate link line 116. The gate insulating layer 117 may include an inorganic insulating material, such as silicon oxide ($SiO_2$) or silicon nitride ($SiN_x$). Subsequently, an intrinsic amorphous silicon layer 118, a doped amorphous silicon layer 119, and a conductive layer 122 are formed on the gate insulating layer 117 by sequentially depositing an intrinsic amorphous silicon material, a doped amorphous silicon material, and a conductive material. The conductive layer 122 may include molybdenum (Mo).

Figure 6C:
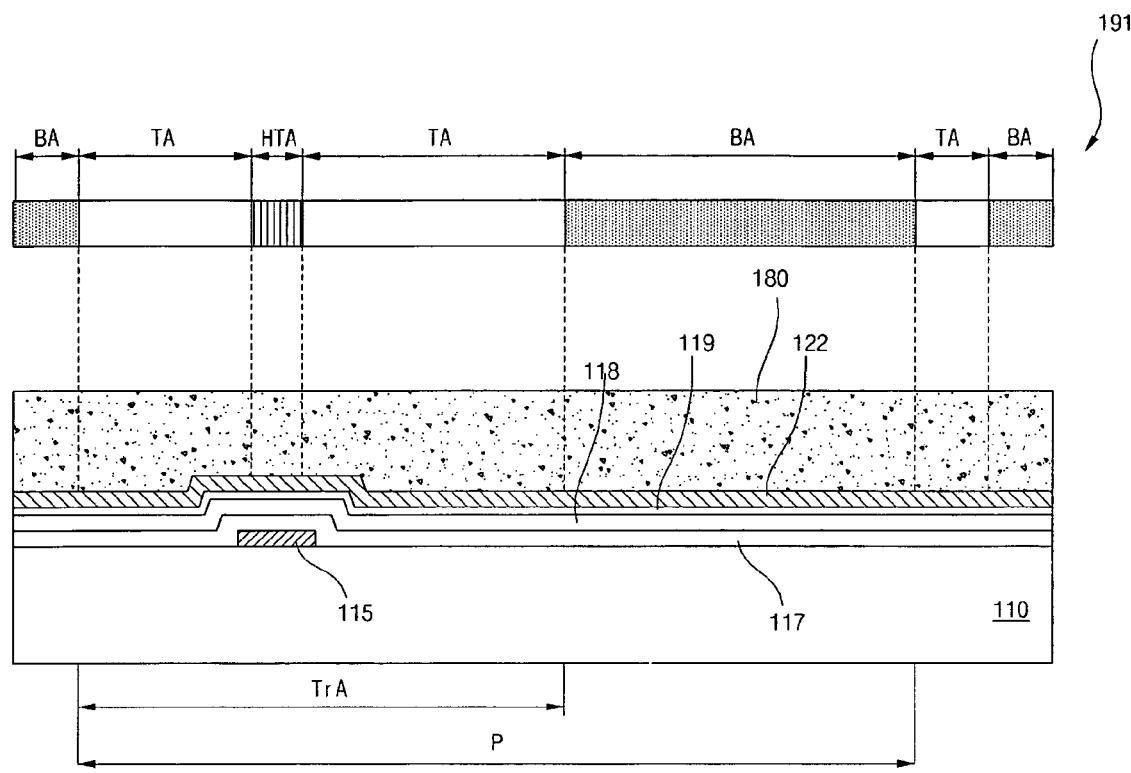
Figure 7C:
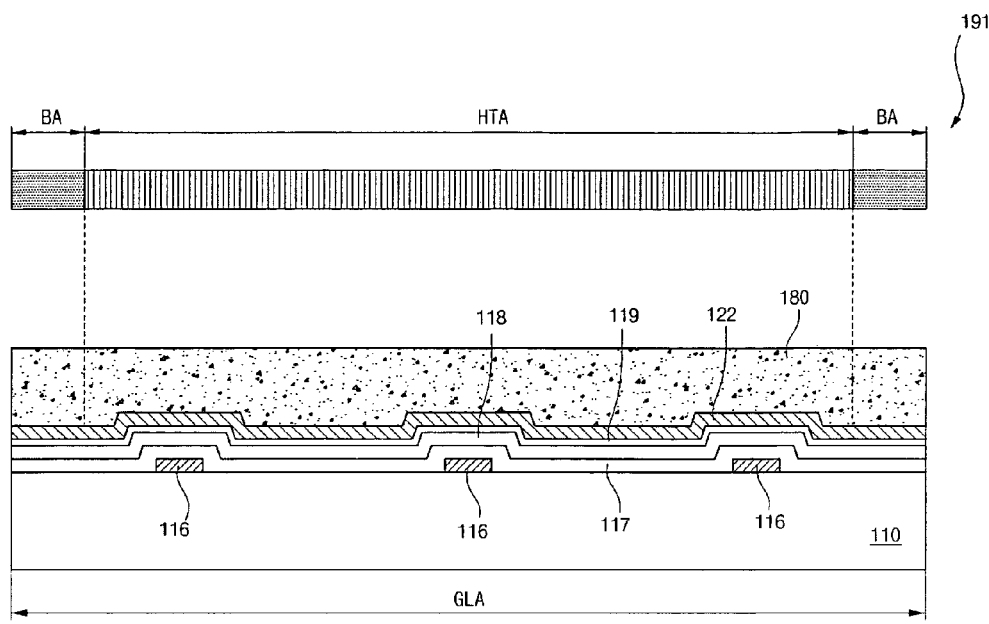

As shown in FIG. 6C and FIG. 7C, a photoresist layer 180 is formed on the conductive layer 122, and a mask 191 is disposed over the photoresist layer 180. Then, the photoresist layer 180 is exposed to light through the mask 191 and developed to form a photoresist pattern. The mask 191 includes a light-transmitting portion TA that transmits about 100% of light, a light-blocking portion BA that blocks about 100% of light, and a half-transmitting portion HTA that selectively transmits light in a range of 0% to 100%.

In addition, the photoresist layer 180 may be a negative type, where a portion, that is exposed to light, remains after developing. In this case, the light-transmitting portion TA of the mask 191 corresponds to regions in which a data line and source and drain electrodes are formed, the half-transmitting portion HTA of the mask 191 corresponds to a region over the gate electrode 116 and between the source and drain electrodes and a region in which a dummy pattern is formed, and the blocking portion BA of the mask 191 corresponds to other regions.

Alternatively, the photoresist layer 180 may be a positive type, where a portion, that is exposed to light, is removed by developing. In this case, arrangements of the light-transmitting portion TA and the light-blocking portion BA of the mask 191 are exchanged to obtain the same pattern as when the photoresist layer 180 being the negative type.

Figure 6D:
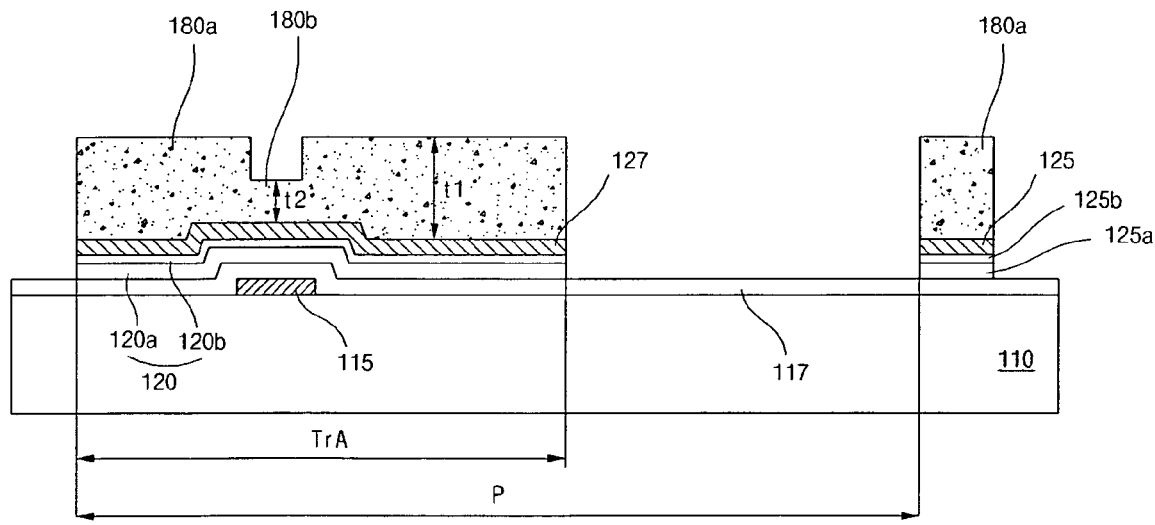
Figure 7D:
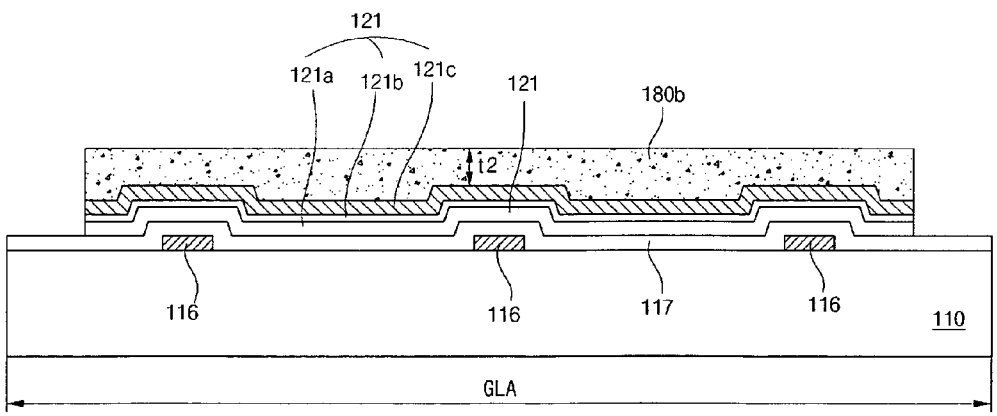

As shown in FIG. 6D and FIG. 7D, the resultant photoresist pattern may have a varying thickness. In particular, a first portion of the photoresist pattern 180a has a first thickness t1 and a second portion of the photoresist pattern 180b has a second thickness t2. The first thickness t1 may be greater than the second thickness t2. For example, when the photoresist layer 180 (shown in FIGS. 6C and 7C) is the negative type, the first portion of the photoresist pattern 180a and the second portion of the photoresist pattern 180b respectively correspond to the light-transmitting portion TA and the half-transmitting portion HTA of the mask 191 (shown in FIGS. 6C and 7C), and the portion of the photoresist layer 180 that corresponds to the light-blocking portion BA of the mask 191, is substantially removed to expose the conductive layer 122.

After forming the photoresist pattern, the conductive layer 122, the doped amorphous silicon layer 119, and the intrinsic amorphous silicon layer 118 (shown in FIGS. 6C and 7C) are etched using the photoresist pattern as an etching mask to form a data line 125, a source-drain pattern 127, a semiconductor pattern 120, and an initial dummy pattern 123. In addition, an intrinsic amorphous silicon pattern 125a and a doped amorphous silicon pattern 125b are further formed under the data line 125.

In particular, the pixel region may be defined by the intersection of the data line 125 and the gate line (not shown). More specifically, because the gate insulating layer 117 is between the data line 125 and the gate line (not shown), the data line 125 and the gate line (not shown) do not contact each other at the intersection. In addition, the source-drain pattern 127 is in the switching region TrA and is electrically connected to the data line 125. For example, the source-drain pattern 127 may protrude from the data line 125. Further, the semiconductor layer 120 is under the source-drain pattern. The initial dummy pattern 123 is in the gate link region GLA and includes an intrinsic amorphous silicon pattern 123a, a doped amorphous silicon pattern 123b, and a conductive pattern 123c.

Figure 6E:
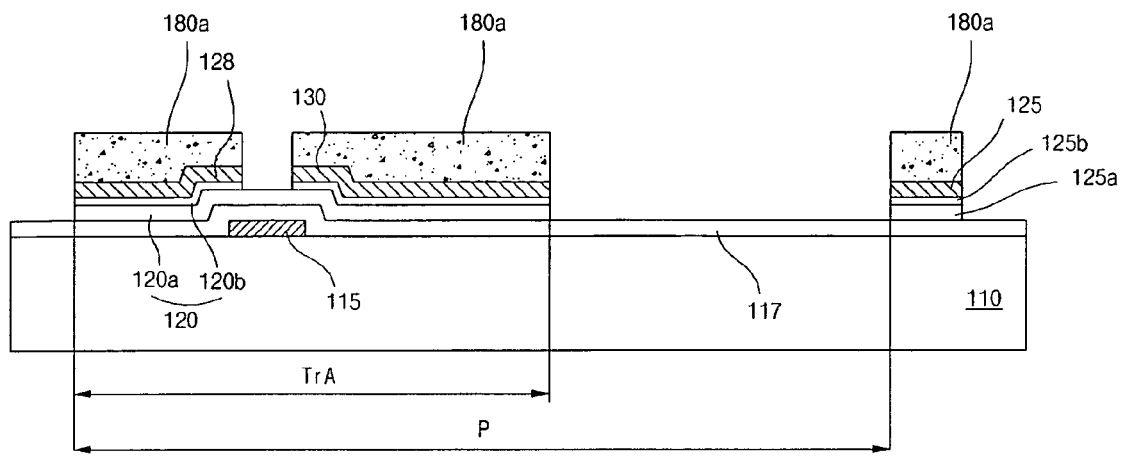
Figure 7E:
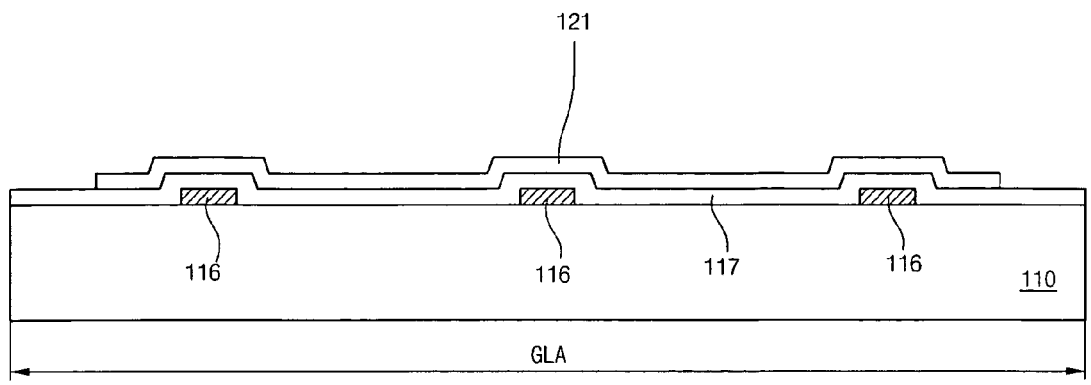

As shown in FIG. 6E and FIG. 7E, the substrate is further etched and the second portion of the photoresist pattern 180b shown in FIGS. 6D and 7D is ultimately removed. In particular, the substrate may undergo an ashing process to shape the photoresist pattern. Consequently, a portion of the source-drain pattern 127, the doped amorphous silicon pattern 123b, and the conductive pattern 123c shown in FIGS. 6D and 7D are exposed and etched. A dry-etching process may be used. Although the thickness of the first portion of the photoresist pattern 180a also decreases due to the ashing and etching, the first portion of the photoresist pattern remains on the substrate 110 covering non-exposed portions of the semiconductor layer 120 and the data line 125.

In particular, the substrate is etched until the exposed portion of the source-drain pattern 127, the doped amorphous silicon pattern 123b, and the conductive pattern 123c (shown in FIGS. 6D and 7D) are removed to form source and drain electrodes 128 and 130, an ohmic contact layer 120b, and an active layer 120a in the switching region TrA and to expose the intrinsic amorphous silicon pattern 123a. A small portion of the active layer 120a and the intrinsic amorphous silicon pattern 123a also may be etched to ensure that the doped amorphous silicon pattern 123b is completely removed. In particular, the active layer 120a functions as a channel of a thin film transistor, and the remaining intrinsic amorphous silicon pattern 123a becomes a dummy pattern 121. As a result, the data line 125, the source and drain electrodes 128 and 130, the ohmic contact layer 120b, the active layer 120a, and the dummy pattern 121 are formed through a second mask process. After etching, remaining of the photoresist pattern is stripped from the substrate.

Figure 6F:
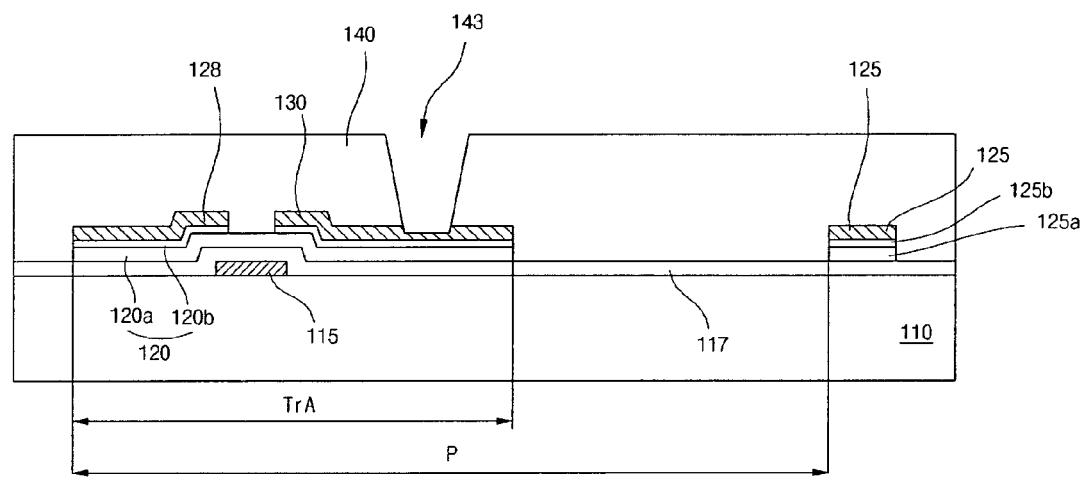
Figure 7F:
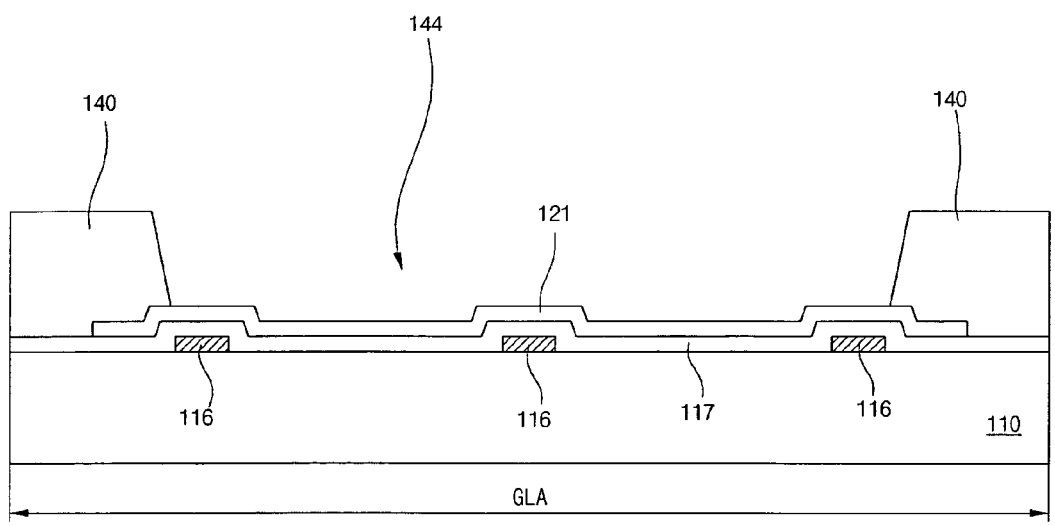

As shown in FIG. 6F and FIG. 7F, a passivation layer 140 is formed on the substrate 110 including the source and drain electrodes 128 and 130, the data line 125 and the dummy pattern 121. The passivation layer 140 may include an organic insulating material, such as benzocyclobutene (BCB) or photo acryl.

Although not shown, a photoresist material is deposited sequentially on the substrate 110, and another photoresist pattern is formed on the passivation layer 140 by a photoresist coating, selective exposure and developing process. After forming the photoresist pattern, the passivation layer 140 is etched using the photoresist pattern as an etching mask to form a drain contact hole 143 in the switching region TrA and to form a through-hole 144 in the gate link region GLA. The drain contact hole 143 exposes an upper surface of the drain electrode 130, or a side surface of the drain electrode 130 and the ohmic contact layer 120b under the drain electrode 130. In addition, the through-hole 144 exposes a portion of the dummy pattern 121. For example, the through-hole 144 may have a shape similar to the dummy pattern 121 but smaller than the dummy pattern 121.

A dry-etching process may be used. In particular, the passivation layer 140 may be over-etched to expose a portion of the drain electrode 130. In particular, the dummy pattern 121 may function as an etch stopper in the gate link region GLA, such that the gate insulating layer 117 under the dummy pattern 121 is not removed. In the switching region TrA, the ohmic contact layer 120b may function as an etch stopper, such that the active layer 120a is removed.

Figure 6G:
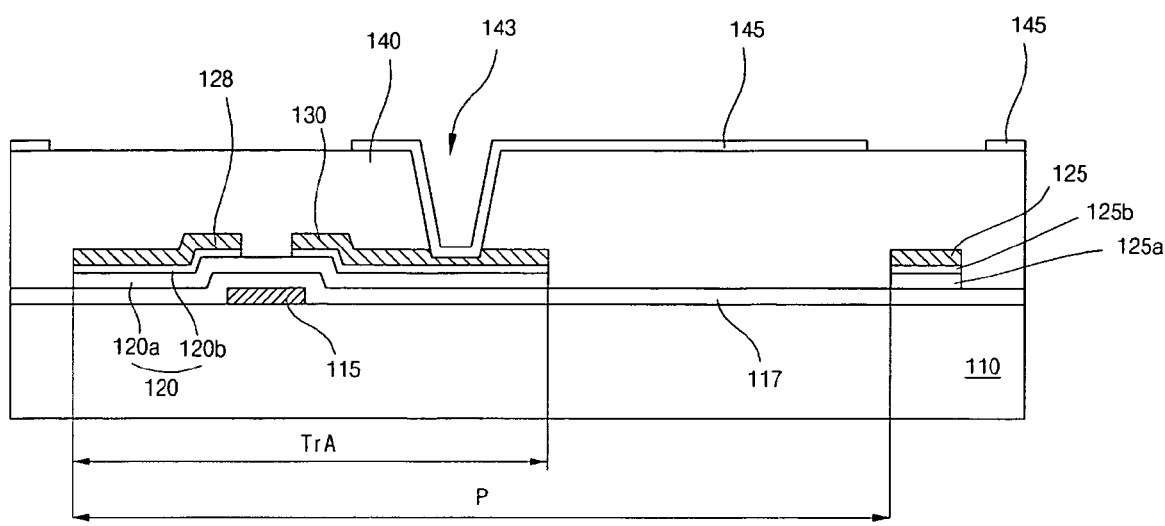

As shown in FIG. 6G, a pixel electrode 145 is formed on the passivation layer 140 in the pixel region P. Although not shown, a transparent conductive material, such as indium tin oxide (ITO) or indium zinc oxide (IZO), and a photoresist material are deposited sequentially on the substrate 110, and another photoresist pattern is formed through a fourth mask process. After forming the photoresist pattern, the transparent conductive material is etched using the photoresist pattern as an etching mask to form the pixel electrode 145. The pixel electrode 145 is electrically connected to the upper surface or the side surface of the drain electrode 130 through the drain contact hole 143. Although not shown, a portion of the pixel electrode 145 may overlap the data line 125.

Figure 7G:
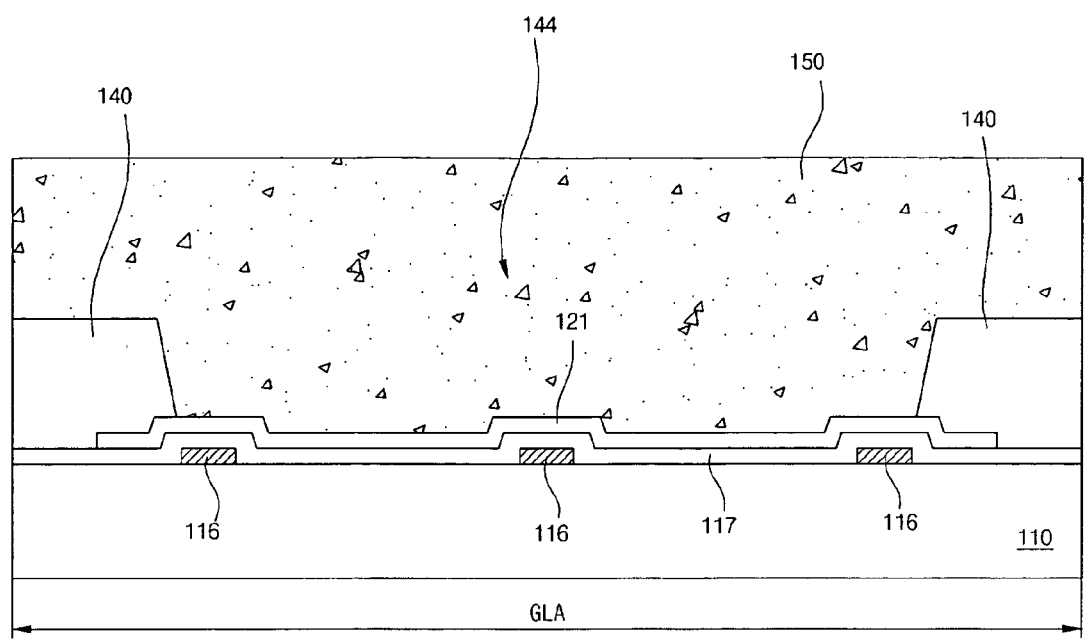

As shown in FIG. 7G, a seal pattern 150 is formed on the passivation layer 140 in the gate link region GLA. The seal pattern 150 also contacts the dummy pattern 121 through the through-hole 144. In addition, the seal pattern 150 may be formed in a non-display area including the gate link region GLA along peripheral portions of the substrate 110. Further, although not shown, the seal pattern 150 alternatively may be formed in a region of another substrate that corresponds to the gate link region GLA, such that when the substrate 110 may be attached to the other substrate by the seal pattern in the gate link region GLA.

Although the patterns in the gate link region are referred to as 'dummy' patterns, these patterns function as etch stoppers during manufacturing and may have other functions.

An array substrate is manufactured through the above processes and then is attached to a color filter substrate. A liquid crystal material is interposed between the attached array substrate and color filter substrate to thereby fabricate a liquid crystal display device.

In embodiments of the present invention, since throughholes are formed in a passivation layer, adhesion between the passivation layer and a seal pattern is improved. In addition, dummy patterns are formed under the passivation layer, thereby preventing exposure of the gate link lines. Since the dummy patterns include intrinsic amorphous silicon, there is no electrical short between the gate link lines and the dummy patterns even if hillock occurs in the gate link region.

Moreover, because an array substrate according to embodiments of the present invention is manufactured through fourmask processes, the one-layer dummy patterns include the same intrinsic semiconductor material as the active layer of the switching element, manufacturing processes and costs are not increased. Further, the one-layer dummy patterns according to an embodiment of the present invention may be employed in other types of display devices, such as organic light emitting diode (OLED) display devices.

It will be apparent to those skilled in the art that various modifications and variations can be made in the array substrate for a liquid crystal display device and a manufacturing method of the same of the present invention without departing from the spirit or scope of the invention. Thus, it is intended that the present invention covers the modifications and variations of this invention provided they come within the scope of the appended claims and their equivalents.

What is claimed is:

1. A substrate for a display device, comprising:
   a plurality of first lines on the substrate in a display area of the display device;
   a plurality of link lines on the substrate in a link region, the link lines electrically connected to the first lines and the link region being in a non-display area of the display device;
   an insulating layer on the first lines and the link lines;
   a plurality of second lines on the insulating layer;
   patterns on the insulating layer in the link region and at least partially overlapping the link lines, the patterns including an intrinsic semiconductor material;
   a passivation layer on the second lines and the patterns, the passivation layer having at least one through hole exposing a top surface of the intrinsic semiconductor material of at least one of the patterns, wherein each of the patterns overlaps at least two of the link lines; and
   a seal pattern on the passivation layer in the link region, the seal pattern directly contacting the exposed top surface of the intrinsic semiconductor material via the through hole.

2. The substrate according to claim 1, wherein the intrinsic semiconductor material includes amorphous silicon.

3. The substrate according to claim 1, wherein the passivation layer includes an organic insulating material.

4. The substrate according to claim 1, wherein the throughhole partially exposes the at least one of the patterns.

5. The substrate according to claim 1, further comprising a thin film transistor and a pixel electrode in each pixel region in the display area, the thin film transistor being connected to at least one of the first lines, one of the second lines and the pixel electrode.

6. The substrate according to claim 5, wherein the thin film transistor includes a gate electrode, an insulation layer, an active layer, an ohmic contact layer, a source electrode and a drain electrode.

7. The substrate according to claim 6, wherein the passivation layer has a drain contact hole exposing the drain electrode in each pixel region.

8. The substrate according to claim 1, further comprising a pixel electrode on the passivation layer in each pixel region in the display area.

9. The substrate according to claim 1, wherein each of the patterns has a single-layer structure.

10. A substrate for a display device, comprising:
    a plurality of first lines on a substrate;
    a link line in a peripheral region of the substrate, the link line electrically connected to one of the first lines;
    an insulating layer on the first lines and the link line;
    a plurality of second lines on the insulating layer;
    a pattern on the insulating layer in the peripheral region and at least partially overlapping the link line, the pattern including a undoped semiconductor material;
    a passivation layer on the second lines and the pattern, the passivation layer having at least one through hole exposing a top surface of the undoped semiconductor material of the pattern, wherein the pattern overlaps adjacent two link lines; and
    a seal pattern on the passivation layer, the seal pattern directly contacting the exposed top surface of the undoped semiconductor material via the through hole.

11. The substrate according to claim 10, wherein the pattern has a single-layer structure of intrinsic amorphous silicon.

12. The substrate according to claim 10, further comprising a switching element at a crossing between one of the first lines and one of the second lines.

* * * * *